United States Patent [19]
Lautzenhiser et al.

[11] Patent Number: 5,464,570
[45] Date of Patent: Nov. 7, 1995

[54] THFA/PDP THERMOSET THICK FILMS FOR PRINTED CIRCUITS

[75] Inventors: Frans P. Lautzenhiser, Noblesville; Bradley H. Carter, Kokomo; Donald A. Ozogar, Kokomo; Dwadasi H. R. Sarma, Kokomo, all of Ind.

[73] Assignee: Delco Electronics Corporation

[21] Appl. No.: 140,958

[22] Filed: Oct. 25, 1993

[51] Int. Cl.$^6$ .................................................... H01B 1/00
[52] U.S. Cl. .............................. 252/500; 427/96; 252/514
[58] Field of Search ............................................... 252/500

[56] References Cited

U.S. PATENT DOCUMENTS

| | | | |
|---|---|---|---|
| 4,529,539 | 7/1985 | Monma et al. | 252/500 |
| 4,552,687 | 11/1985 | Beacham et al. | 252/500 |
| 4,747,966 | 5/1988 | Maeno et al. | 252/500 |
| 4,798,686 | 1/1989 | Hocker et al. | 252/500 |
| 4,929,388 | 5/1990 | Wessling | 252/500 |
| 5,162,087 | 11/1992 | Fukuzawa et al. | 252/500 |

*Primary Examiner*—Wayne Langel
*Attorney, Agent, or Firm*—Cary W. Brooks; Mark A. Navarre

[57] ABSTRACT

The invention includes the discovery that the addition of a thermosetting polymer to a thick-film conductor formulation including a thermoplastic polymer will substantially retard the spreading of the thick-film conductor ink upon firing of the printed conductor. The thermosetting polymer may be from the family of allylic esters, for example poly(diallyl phthalate). The invention also includes the discovery that the thermosetting resin can be dissolved with an organic solvent to form an additive so as to uniformly distribute the thermosetting polymer within the thick-film conductor formulation including the thermoplastic polymers. Preferred organic solvents include alcohols with a weight ratio of thermoset-to-organic solvent ranging from about 1:1.5 to about 1:3.

5 Claims, No Drawings

THFA/PDP THERMOSET THICK FILMS FOR PRINTED CIRCUITS

FIELD OF THE INVENTION

This invention relates to thick-film conductor formulations for printed circuits, and more particularly to a thick-film conductor formulation including a THFA/PDP thermoset additive.

BACKGROUND OF THE INVENTION

The use of thermoplastics in thick-film conductor formulations for printing circuits is known. However, the use of thermoplastics in thick-film conductor formulations often results in the spreading of the printed lines upon drying. This is particularly a problem where printed conductor lines intersect at dielectric crossovers. When the temperature of printed conductor lines including thermoplastic polymers is increased at drying, the viscosity of the thermoplastics decrease, resulting in a spreading of the conductor ink used to print the conductor lines. As a result, shorting, or near shorts, may occur when parallel conductor lines are printed at dielectric crossovers. The problem is exacerbated when the conductor line is co-fired with one of the layers of the crossover dielectrics, because of the high steps which occur at these crossover geometries. Thus, heretofore, there has been a need to prevent the spread of thick-film conductor thermoplastic formulations upon firing.

A related problem occurs when inks are printed in through-holes. Although clear after printing, many inks "slump" during drying, blocking the through-hole. To control the problem, the visco-elasticity of the ink is increased. However, this may result in an ink which is too thick for optimal printing of other features.

SUMMARY OF THE INVENTION

The invention includes the discovery that the addition of a thermosetting polymer to a thick-film conductor formulation including a thermoplastic polymer will substantially retard the spreading of the thick-film conductor ink upon firing of the printed conductor. The thermosetting polymer may be from the family of allylic esters or allyls, for example poly(diallyl phthalate) (hereafter referred to as PDP). The PDP has a repeating chemical unit of diallyl phthalate.

The invention also includes the discovery that the thermosetting plastic can be dissolved with an organic solvent so as to uniformly distribute the thermosetting polymer within the thick-film conductor formulation including the thermoplastic polymers. Preferred organic solvents include tetrahydrofurfuryl alcohol with a weight ratio of thermoset-to-organic solvent ranging from about 1:2 to about 1:3.

These and other features, objects and advantages of the present invention will become apparent from the following detailed description and appended claims.

DETAILED DESCRIPTION

The present invention includes the addition of a thermosetting polymer to a thick-film conductor formulation including thermoplastic polymers to substantially retard the spreading of the conductor ink upon firing of a printed conductor using the formulation. The term "thermosetting polymer" as used herein means a polymer which crosslinks, hardens, and becomes insoluble with the addition of heat and solvent loss. The thermosetting polymer may also be from the class of alkyds, phenolic, or vinyl ester. Examples of such thermosetting polymers include Glaskyd®, Tecolite®, and Hetron®, respectively. A particular preferred thermosetting polymer is poly(diallyl phthalate) (PDP). Suitable thermoplastic polymers include the family of ethyl cellulose or acrylic resins, for example K-200 ethyl cellulose, or isobutyl methacrylate, respectively.

To facilitate blending with the thick-film conductor formulation including thermoplastic polymers, the thermosetting polymer is dissolved, usually in an alcohol. Suitable alcohols include benzyl alcohol and tetrahydrofurfuryl alcohol. Also, tetrahydrofuran, a cyclic ether, may be used. A preferred alcohol is tetrahydrofurfuryl alcohol (THFA). The thermosetting polymer or resin and alcohol may be mixed in a weight ratio ranging from about 1:1 to about 1:9, preferably 1:1 to about 1:3 and most preferably at a ratio of about 1:2 thermoset polymer to organic vehicle. The combination of thermosetting polymer and alcohol may replace from about 1 to about 30 percent by weight of the thermoplastic in the thick-film conductor composition. Such a thick-film conductor composition may also include from 0 to about 5 weight percent inorganic oxides, from 0 to about 5 weight percent glass frit, from about 0.7 percent to about 1.5 weight percent thermoplastic polymer, and from about 0.05 to about 0.5 weight percent thermosetting polymer, and about 0.5 to 1.0 weight percent surfactant. In general, a composition according to this invention may include 73 to about 77 weight percent of an electrically conductive material, 0.8 to about 1.2 weight percent of a thermoplastic resin, 0.05 to about 0.5 weight percent of a thermosetting polymer, and 10 to about 20 weight percent of an organic vehicle selected from the group consisting of organic alcohols, ethers and esters.

When the thick-film conductor formulation including the thermosetting polymer is heated, the thermosetting polymer crosslinks, increasing the viscosity of the conductor film. As a result, the spreading at crossovers is significantly reduced. The following example illustrates the improvement in significant retardation of the spread of the thick-film conductor ink on firing.

EXAMPLE 1

In this example, two similar inks were prepared utilizing the same amount of silver/palladium powder, inorganic oxides, and vehicle. The first ink included about 1 weight percent of the thermoplastics known as K-200 ethyl cellulose and 2045 Elvacite® without any thermosetting polymer.

The second ink included about 0.15 weight percent of PDP and 0.34 weight percent THFA. The ratio of PDP to THFA was about 1:2. The second ink also included about 0.85 weight percent of the thermoplastic known as K-200 ethyl cellulose and 2045 Elvacite®. As such, the second ink differed from the first ink by replacing 0.15 percent by weight of the thermoplastic polymer with the PDP, and about 0.30 percent of the normal solvent system (alcohols ethers, or esters) with THFA. The THFA/PDP solution constituted 0.45 weight percent of the total ink composition.

Each ink was used to print a separate conductor line having a width of 25 mils. After firing, the first conductor line had a width of 30 mils at a dielectric crossover step. Thus, the first conductor line spread 5 mils.

After firing, the second conductor line, including the conductor formulation according to the present invention, had a width of 27 mils. Thus, the second conductor line spread only 2 mils. According to the present invention, by replacing a portion of the thermoplastic with a thermosetting resin, the lines spread on firing was reduced by 60 percent.

The embodiments of the invention in which an exclusive property or privilege is claimed as defined as follows:

1. An electrically conductive thick film ink composition including electrically conductive powder and a thermoplastic polymer containing organic vehicle for a process in which the composition is printed onto a substrate and then subjected to a firing operation to form a glaze, the improvement wherein:

said thermoplastic polymer comprises 0.8 to about 1.2 weight percent of the composition;

said organic vehicle is selected from the group consisting of organic alcohols, ethers and esters, and comprises 10 to about 20 weight percent of the composition; and said electrically conductive powder comprises 73 to about 77 weight percent of the composition, and said organic vehicle includes a thermosetting polymer in addition to the thermoplastic polymer for retarding spreading of the printed composition during the firing operation, the thermosetting polymer comprising 0.05 to about 0.5 weight percent of the composition.

2. The improvement of claim 1, wherein the thermosetting polymer, dissolved with a solvent, constitutes from 1 to 30 percent by weight of said organic vehicle.

3. The improvement of claim 2, wherein said thermosetting polymer includes poly(diallyl phthalate), and said solvent includes tetrahydrofurfuryl alcohol.

4. The improvement of claim 3, wherein said thermosetting polymer and solvent have a polymer-to-solvent weight ratio of 1:1 to 1:3.

5. The improvement of claim 3, wherein the thermosetting polymer and solvent constitutes about 0.45 weight percent of the thick film composition.

* * * * *